US010295635B2

(12) United States Patent
Fautz

(10) Patent No.: US 10,295,635 B2
(45) Date of Patent: May 21, 2019

(54) METHOD AND APPARATUS FOR ACQUIRING IMAGE DATA FROM A SUBJECT USING A MAGNETIC RESONANCE SEQUENCE HAVING AN ADIABATIC RADIO-FREQUENCY

(71) Applicant: Siemens Aktiengesellschaft, Munich (DE)

(72) Inventor: Hans-Peter Fautz, Forchheim (DE)

(73) Assignee: Siemens Aktiengesellschaft, Munich (DE)

( * ) Notice: Subject to any disclaimer, the term of this patent is extended or adjusted under 35 U.S.C. 154(b) by 647 days.

(21) Appl. No.: 14/972,424

(22) Filed: Dec. 17, 2015

(65) Prior Publication Data
US 2016/0178714 A1    Jun. 23, 2016

(30) Foreign Application Priority Data
Dec. 17, 2014    (DE) .................. 10 2014 226 262

(51) Int. Cl.
*G01V 3/00* (2006.01)
*G01R 33/54* (2006.01)
*G01R 33/483* (2006.01)
*G01R 33/565* (2006.01)

(52) U.S. Cl.
CPC ......... *G01R 33/543* (2013.01); *G01R 33/483* (2013.01); *G01R 33/5659* (2013.01); *G01R 33/56563* (2013.01)

(58) Field of Classification Search
USPC ....................................................... 324/309
See application file for complete search history.

(56) References Cited

U.S. PATENT DOCUMENTS

| 6,094,049 A * | 7/2000 | Rosenfeld ............ G01R 33/446 324/307 |
| 7,847,551 B2 | 12/2010 | Park |
| 8,148,979 B1 * | 4/2012 | Du ...................... G01R 33/4816 324/307 |
| 2006/0253015 A1 | 11/2006 | Nezafat et al. |

(Continued)

FOREIGN PATENT DOCUMENTS

DE    4232883 A1    3/1994

OTHER PUBLICATIONS

Tannus et al.: "Adiabatic Pulses", NMR in Biomedicine, vol. 10, pp. 423-434; (1997).

(Continued)

*Primary Examiner* — Rodney E Fuller
(74) *Attorney, Agent, or Firm* — Schiff Hardin LLP

(57) ABSTRACT

In a method and apparatus for acquiring magnetic resonance image data of an object by execution of a magnetic resonance data acquisition sequence that includes at least one adiabatic radio-frequency pulse, at least one parameter for the object under investigation is acquired that is specific to the object under investigation. At least one pulse parameter of the at least one adiabatic radio-frequency pulse is adjusted using the at least one parameter for the object under investigation. Magnetic resonance image data of the object under investigation are acquired by execution of the magnetic resonance sequence, using the at least one adiabatic radio-frequency pulse with the adjusted at least one pulse parameter.

12 Claims, 2 Drawing Sheets

(56) References Cited

U.S. PATENT DOCUMENTS

2009/0230958 A1* 9/2009 Balchandani ...... G01R 33/4833
   324/309
2011/0144474 A1  6/2011 Ouwerkerk
2013/0342206 A1  12/2013 Ugurbil
2015/0245778 A1* 9/2015 Holscher .............. A61B 5/0263
   600/419

OTHER PUBLICATIONS

Balchandani et al. "Improved Slice-Selective Adiabatic Excitation"; Magnetic Resonance in Medicine 71; pp. 75-82; (2014).

* cited by examiner

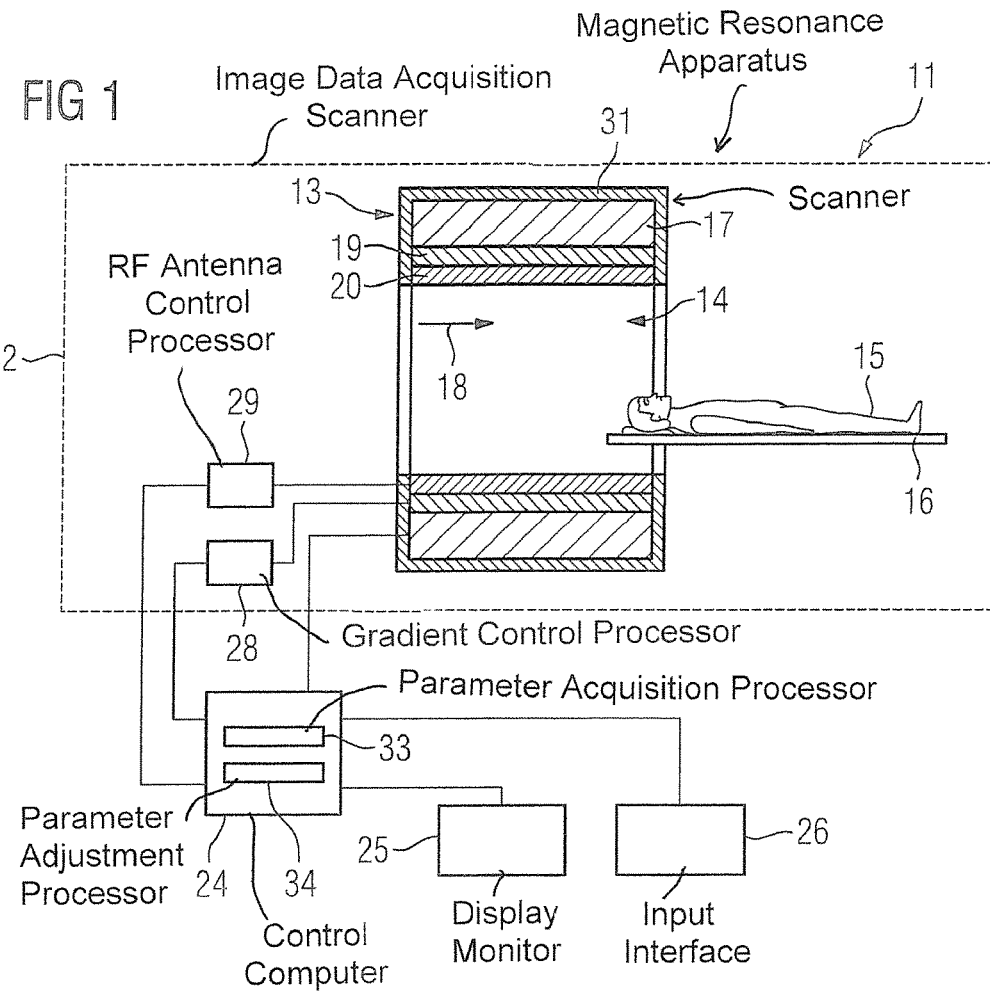
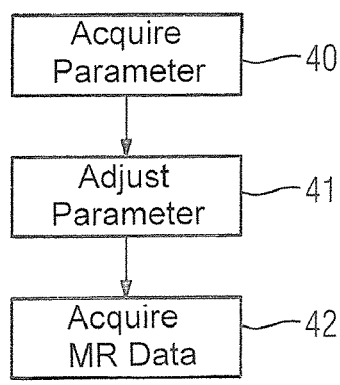

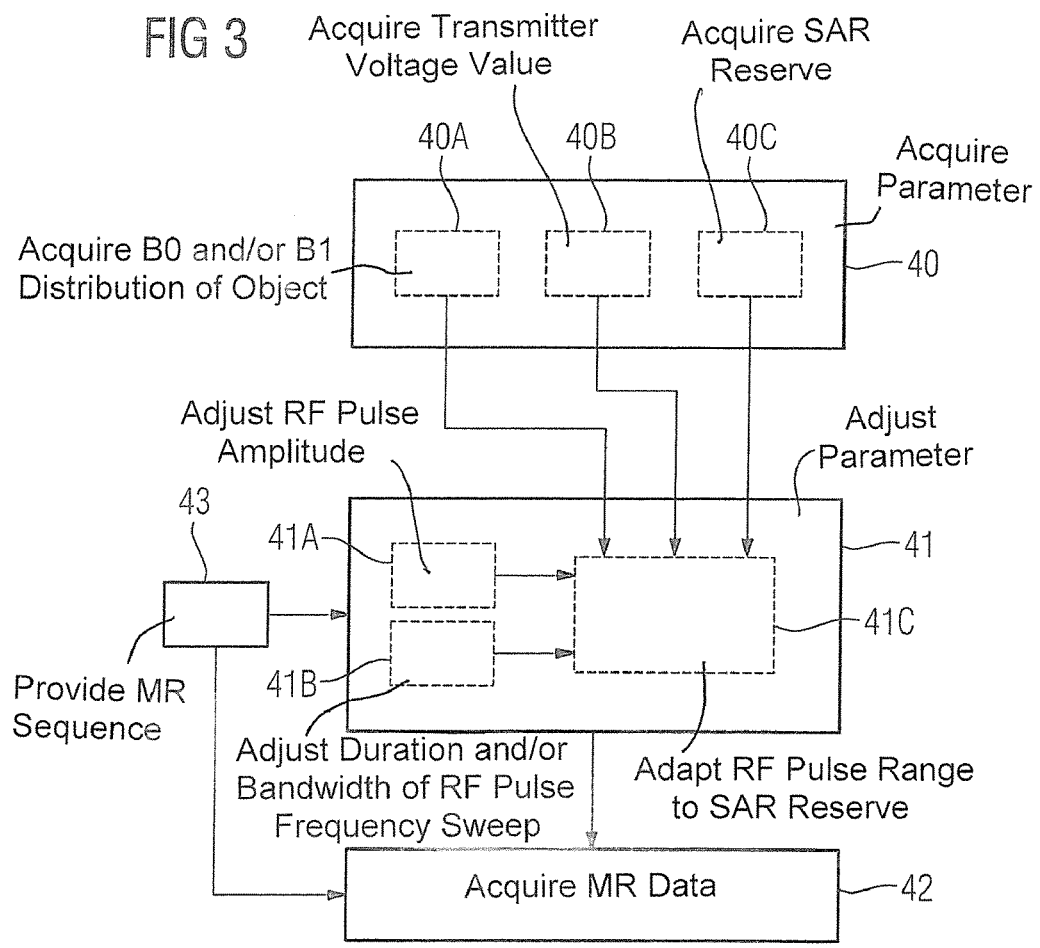

METHOD AND APPARATUS FOR ACQUIRING IMAGE DATA FROM A SUBJECT USING A MAGNETIC RESONANCE SEQUENCE HAVING AN ADIABATIC RADIO-FREQUENCY

BACKGROUND OF THE INVENTION

Field of the Invention

The present invention concerns a method for acquiring magnetic resonance image data of an object under investigation by the use of a magnetic resonance sequence that includes at least one adiabatic radio-frequency pulse, as well as a magnetic resonance apparatus and a non-transitory, computer-readable data storage medium encoded with programming instructions to implement such a method.

Description of the Prior Art

In a magnetic resonance apparatus, also called a magnetic resonance tomography system, usually the body of a subject undergoing investigation, in particular a patient, is exposed to a relatively strong basic magnetic field, for example of 1.5 or 3 or 7 tesla, by operation of a basic field magnet. In addition, a gradient coil arrangement is used to apply gradient fields. Suitable radio-frequency antennas are used to emit radio-frequency pulses, for example excitation pulses, and this results in nuclear spins of certain atoms that are excited to resonance by these radio-frequency pulses being tipped by a defined flip angle in relation to the magnetic field lines of the basic magnetic field. During relaxation of the nuclear spins, radio-frequency signals—so-called magnetic resonance signals—are emitted and these are received using suitable radio-frequency antennas, and then subjected to further processing. Finally, the desired image data can be reconstructed from the raw data that is acquired in this way.

Thus, for a particular measurement, it is necessary to emit a magnetic resonance sequence, also called a pulse sequence that includes a sequence of radio-frequency pulses, for example excitation pulses and refocusing pulses, and gradients that are switched in a manner coordinated therewith, on different gradient axes in different spatial directions. Timed to coincide with this, readout windows are defined to predetermine the periods during which the induced magnetic resonance signals are acquired.

In this context, a magnetic resonance sequence may provide for the use of at least one adiabatic radio-frequency pulse. Adiabatic radio-frequency pulses are known for example from the paper by Tannus et al., "Adiabatic Pulses", NMR in Biomed, 10, 423-434 (1997). In general, an adiabatic radio-frequency pulse is a pulse whose frequency or phase is modulated. At the same time, the adiabatic radio-frequency pulse may include modulation of an amplitude. An adiabatic pulse may be designed to excite all the nuclear spins of an investigated area of an examination object to the same extent. In this case, an adiabatic radio-frequency pulse typically has the advantage that excitation of the nuclear spins and/or a flip angle of the adiabatic radio-frequency pulse is insensitive to a certain insensitivity range of B0 variations and/or B1 variations. Because of this, an adiabatic radio-frequency pulse may be suitably used even when there are inhomogeneities in the magnetic field.

SUMMARY OF THE INVENTION

An object of the invention is to provide a method for acquiring magnetic resonance image data that is adapted to the object under investigation in a particularly advantageous manner.

The method according to the invention for acquiring magnetic resonance image data of an object under investigation by means of a magnetic resonance sequence that includes at least one adiabatic radio-frequency pulse includes the following method steps. At least one parameter for the object under investigation is acquired that is specific to the object under investigation. At least one pulse parameter of the at least one adiabatic radio-frequency pulse is adjusted, using the at least one parameter. Magnetic resonance image data of the object under investigation are acquired by execution of the magnetic resonance sequence, using the at least one adiabatic radio-frequency pulse with the adjusted at least one pulse parameter.

The object under investigation may be a patient, a person used for training, or a phantom. The magnetic resonance image data that are acquired are provided, by being displayed to a user at a display monitor and/or stored in a database.

The at least one adiabatic radio-frequency pulse may take the form of an adiabatic preparation pulse. Typically, a preparation pulse results in the preparation, in particular a deflection, of the spins in an investigated area of the object under investigation. Thus, a preparation pulse may result in the preparation of the magnetization prevailing in the investigated area, such as a longitudinal magnetization. The at least one adiabatic radio-frequency pulse may take the form of an adiabatic inversion pulse. An inversion pulse rotates the magnetization, typically by at least 150° and at most 210°, in particular by 180°. The adiabatic inversion pulse may have a target flip angle of 180°. Thus, the inversion pulse may bring about a reversal of the magnetization, in particular longitudinal magnetization, from positive to negative values. Typically, inversion pulses are used in inversion recovery magnetic resonance sequences, such as a STIR sequence, a FLAIR sequence or a SPAIR sequence. It goes without saying that the at least one adiabatic radio-frequency pulse may also fulfill a different function in the magnetic resonance sequence. For example, it is also possible for the at least one adiabatic radio-frequency pulse to take the form of an excitation pulse or refocusing pulse or another type of radio-frequency pulse that is considered useful to those skilled in the art.

The at least one parameter for the object under investigation is specific to the object under investigation from which magnetic resonance image data are acquired. The at least one parameter for the object under investigation may in this case result from body-specific properties that are associated with the object under investigation. The at least one parameter for the object under investigation is thus typically different for different investigated objects that are examined by the magnetic resonance apparatus. The at least one parameter for the object under investigation may thus change when different objects under investigation are examined. The at least one parameter for the object under investigation is acquired when the object under investigation is positioned within the magnetic resonance apparatus for the purpose of acquiring the magnetic resonance image data. Thus, the parameter for the object under investigation is in particular dependent on an interaction between the object under investigation and magnetic fields of the magnetic resonance apparatus when the object under investigation is positioned in a patient-receiving area of the scanner of the magnetic resonance apparatus. The at least one parameter for the object under investigation may in this context characterize an influence exerted by the object under investigation on acquisition of the magnetic resonance image data. Thus, the at least one parameter for the object under investigation can determine boundary conditions under which the magnetic resonance image data are acquired. On the basis of the at least one parameter for the object under investigation, it is possible to adjust, in particular automatically, imaging parameters of the magnetic resonance scanner for acquisition of the magnetic resonance image data.

It should be noted that the at least one parameter for the object under investigation is not predetermined by a user during adjustment of the magnetic resonance sequence. Thus, the at least one parameter for the object under investigation is different from sequence parameters of the magnetic resonance sequence, which are typically predetermined by a user. Thus, the at least one parameter for the object under investigation does not include, for example, adjustment of an imaging area (field of view, FOV) of the magnetic resonance sequence even if this imaging area has been adjusted to the object under investigation.

The at least one pulse parameter may characterize the at least one adiabatic radio-frequency pulse. Thus, the at least one adiabatic radio-frequency pulse may be adjusted and/or modulated dependent on the at least one pulse parameter. Possible pulse parameters—such as amplitude, duration of a frequency sweep, bandwidth of a frequency sweep—are described below. The at least one pulse parameter may also be designed to be variable with location. This means in particular that the at least one adiabatic radio-frequency pulse for acquisition of the magnetic resonance image data acts differently on different local areas, it being possible to adjust the different local areas by means of the location-variable at least one pulse parameter.

Adjustment of the at least one pulse parameter may include loading a predetermined and/or user-adjusted standard pulse parameter, in particular from a database. The standard pulse parameter may also be established by the magnetic resonance sequence used for acquiring the magnetic resonance image data. In that case, adjustment of the at least one pulse parameter includes in particular adjusting the standard pulse parameter using the at least one parameter for the object under investigation. The at least one parameter for the object under investigation may in this case be entered as an input parameter in an algorithm by means of which the at least one pulse parameter is adjusted. The at least one pulse parameter may also be adjusted within at least one boundary condition, wherein the at least one boundary condition is advantageously based on the at least one parameter for the object under investigation.

The fact that the magnetic resonance image data are acquired by execution of the magnetic resonance sequence using the at least one adiabatic radio-frequency pulse means that the magnetic resonance sequence used to acquire the magnetic resonance image data provides for application of the at least one adiabatic radio-frequency pulse. The at least one adiabatic radio-frequency pulse may in this case be applied repeatedly. The at least one adiabatic radio-frequency pulse is applied during acquisition of the magnetic resonance image data in particular by a radio-frequency antenna unit of the magnetic resonance scanner. The radio-frequency antenna unit may in this case be controlled by a radio-frequency antenna control processor of the magnetic resonance apparatus such that the at least one adiabatic radio-frequency pulse is applied using the adjusted at least one pulse parameter. For this, the radio-frequency antenna control unit may be in connection, for the purpose of data exchange, with a parameter adjustment processor of a computer of the magnetic resonance apparatus, wherein the parameter adjustment unit adjusts the at least one pulse parameter of the at least one adiabatic radio-frequency pulse.

The procedure according to the invention is based on the insight that conventional adiabatic radio-frequency pulses are typically applied only with at least one standard pulse parameter that is suitable for a large patient population. Consequently, the at least one standard pulse parameter of conventional adiabatic radio-frequency pulses typically represents a compromise that produces sufficient image quality of the magnetic resonance image data that are acquired using the conventional adiabatic radio-frequency pulse for a large patient population.

The procedure according to the invention offers the advantage that the at least one adiabatic radio-frequency pulse can be adapted (matched) in a particularly advantageous manner to the object under investigation from which the magnetic resonance image data are to be acquired using the at least one adiabatic radio-frequency pulse. The at least one adiabatic radio-frequency pulse can in this way be tailored specifically to particular objects of investigation. Consequently, the magnetic resonance image data can be acquired, using the adapted at least one adiabatic radio-frequency pulse, in a manner that is customized to the respective object under investigation in a particularly advantageous manner. Thus, accuracy of the at least one adiabatic radio-frequency pulse may be enhanced, particularly with respect to a flip angle through which nuclear spins are deflected by the at least one adiabatic radio-frequency pulse. In this way, image quality of the magnetic resonance image data may be enhanced. It is also possible to improve the safety of the object under investigation.

In this way, it is specifically adiabatic radio-frequency pulses that can be adapted particularly advantageously to the object under investigation, since adiabatic radio-frequency pulses are to be used to excite nuclear spins in a manner independent of inhomogeneities of a B0 field and/or B1 field that are brought about by the object under investigation. At the same time, adiabatic radio-frequency pulses are typically associated with a high specific absorption rate (SAR), as a result of which adiabatic radio-frequency pulses may result in increased heating of tissue in the object under investigation.

In an embodiment, the at least one pulse parameter includes the amplitude of the at least one adiabatic radio-frequency pulse. Consequently, the amplitude of the at least one adiabatic radio-frequency pulse can be adapted to the object under investigation in a particularly advantageous manner. For example, it may be ensured that the at least one adiabatic radio-frequency pulse is radiated at an amplitude that is sufficiently strong to ensure sufficient image quality of the magnetic resonance image data, but does not exceed a limit value adapted to the object under investigation. In this way, it is possible, at the same time as enhancing the image quality of the magnetic resonance image data, to increase the safety of the object under investigation, particularly with respect to heating of tissue of the object under investigation.

In another embodiment, the at least one pulse parameter includes the duration and/or the bandwidth of a frequency sweep of the at least one adiabatic radio-frequency pulse. The frequency sweep of an adiabatic radio-frequency pulse typically covers a change in frequency of the adiabatic radio-frequency pulse over time, such as over the period during which the adiabatic radio-frequency pulse is applied. In this context, the frequency sweep is usually of a bandwidth that indicates the frequency range and/or the frequency band over which the frequency of the adiabatic radio-frequency pulse is to be changed over time. Furthermore, the frequency sweep is typically of a duration that indicates the duration for application of the adiabatic radio-frequency pulse. The duration of the frequency sweep may also specify a duration for the change in frequency of the adiabatic radio-frequency pulse, particularly the bandwidth of the frequency sweep. Reducing the duration of the frequency sweep may in this way result in an increase in the velocity of the frequency sweep. In this way, the duration and/or bandwidth of the frequency sweep may be adapted specifically to the object under investigation, using the at least one parameter for the object under investigation. In this way, it is possible for example, as described below, to adapt an insensitivity range of variations in the B0 distribution and/or B1 distribution of the adiabatic radio-frequency pulse, which results directly from the duration and/or bandwidth of the frequency sweep, to inhomogeneities in the B0 distribution and/or B1 distribution that are induced by the object under investigation. The bandwidth and/or the duration of the frequency sweep are also in particular directly linked to an SAR load by the application of the adiabatic radio-frequency pulse, wherein the permitted SAR load may be adapted specifically to the object under investigation in a particularly advantageous manner.

In another embodiment, the at least one adiabatic radio-frequency pulse has an insensitivity to an insensitivity range of variations in a B0 distribution and/or B1 distribution, wherein the at least one pulse parameter is adjusted such that the insensitivity range is adapted to the at least one parameter for the object under investigation. Variations in the B0 distribution and/or B1 distribution in particular indicate a spatial change in the B0 distribution and/or B1 distribution in a body of the object under investigation. The variations in the B0 distribution and/or B1 distribution may describe an inhomogeneity in the B0 distribution and/or B1 distribution that is possibly caused by the object under investigation. In this way, the matter of the body of the object under investigation may influence homogeneity of the B0 distribution and/or B1 distribution.

The insensitivity range of the at least one adiabatic radio-frequency pulse may indicate the range of variations in the B0 distribution and/or B1 distribution to which the at least one adiabatic radio-frequency pulse is insensitive. In that case, the at least one adiabatic radio-frequency pulse is insensitive in particular to a predetermined insensitivity range of variations in a B0 distribution and/or B1 distribution when an adiabatic condition prevails. In this context, an adiabatic condition is known to those skilled in the art and thus need not be discussed in more detail herein. Whether the at least one adiabatic radio-frequency pulse is insensitive to a predetermined B0 distribution, and/or B1 distribution and thus the adiabatic condition prevails, typically depends on at least one of the following pulse parameters of the at least one adiabatic radio-frequency pulse: an amplitude of the at least one adiabatic radio-frequency pulse, a bandwidth of a frequency sweep of the at least one adiabatic radio-frequency pulse, or a duration of the frequency sweep of the at least one adiabatic radio-frequency pulse.

Thus, an adjustment of the insensitivity range of the at least one adiabatic radio-frequency pulse can include an adjustment of at least one pulse parameter of the pulse parameters of the at least one adiabatic radio-frequency pulse. The at least one pulse parameter may in this case be adjusted such that the insensitivity range of the at least one adiabatic radio-frequency pulse lies within at least one boundary condition predetermined by the at least one parameter for the object under investigation. For example, the at least one parameter for the object under investigation may predetermine that there are inhomogeneities, induced by the object under investigation, in the B0 distribution and/or B1 distribution. The insensitivity range of the at least one adiabatic radio-frequency pulse may in that case be adapted precisely to these induced inhomogeneities such that the at least one adiabatic radio-frequency pulse is not sensitive to these induced inhomogeneities. For this purpose, as described below, it may be advantageous for the parameter for the object under investigation that is acquired to be a B0 distribution and/or a B1 distribution of the object under investigation. The at least one pulse parameter may in this case be adjusted such that the insensitivity range is adapted to a measure of variations in the B0 distribution and/or the B1 distribution. The at least one pulse parameter may in this case be adjusted such that the at least one adiabatic radio-frequency pulse, as a result of its structure, compensates for a range of variations in the B0 distribution and/or the B1 distribution that is defined by the insensitivity range. Consequently, the at least one adiabatic radio-frequency pulse may, particularly advantageously, be adapted to the specific object under investigation, with the result that despite the presence of inhomogeneities in the B0 distribution and/or the B1 distribution magnetic resonance image data of high image quality can be acquired.

In another embodiment, the acquisition of the at least one parameter for the object under investigation includes acquisition of a B0 distribution and/or B1 distribution of the object under investigation that is specific to the object under investigation. In particular, the B0 distribution indicates a distribution of the strength of the main magnetic field of the magnetic resonance apparatus within the object under investigation. The B1 distribution indicates how strong a B1 field is at a particular location in the object under investigation at a particular excitation, for example a unit of excitation, and/or at a particular transmitter voltage. In order to determine the amplitude of the B1 field, it is known, for example, to measure the flip angle caused by one of the at least one adiabatic radio-frequency pulse(s). Possible ways of acquiring the B0 distribution and/or the B1 distribution, so-called "B0 mapping" and/or "B1 mapping", are known to those skilled in the art and thus need not be discussed in more detail herein.

The B0 distribution and/or B1 distribution offers a particularly suitable starting point for adjusting the at least one pulse parameter of the at least one adiabatic radio-frequency pulse, since as a result, for example, the aforementioned insensitivity range of the at least one adiabatic radio-frequency pulse may be selected in a particularly advantageous manner. In this context, the at least one adiabatic radio-frequency pulse is not adapted to the B0 distribution and/or B1 distribution in a manner modulated depending on location. Rather, and particularly advantageously, a value of an inhomogeneity of the B0 distribution and/or B1 distribution can be established in a critical part of a capture region of the magnetic resonance image data, and then the insensitivity range of the at least one adiabatic radio-frequency pulse can be adapted to the value of the inhomogeneity. In this context, a critical part of this kind in the capture region represents the part of the capture region in which particularly high levels of inhomogeneity of the B0 distribution and/or B1 distribution are to be expected and/or are present in relation to the rest of the capture region. In the case of brain imaging, typically the cranial base of the object under investigation represents a critical part of the capture region of this kind. Thus, the capture region of the magnetic resonance image data may be divided into subregions of different importance, wherein the B0 distribution and/or the B1 distribution in the subregions are given different weighting in contributing to the adjustment of the at least one pulse parameter.

In another embodiment, the acquisition of the at least one parameter for an object under investigation includes acquisition of a value, specific to the object under investigation, of a transmitter voltage that is adjusted during transmitter set-up. In this context, the transmitter voltage may be determined in combination with the at least one SAR reserve, which is described below. The transmitter voltage can provide a return that can be independent of location, to a B1 distribution in the object under investigation. The at least one pulse parameter may in this way be adapted to an inhomogeneity in the B1 distribution in a particularly simple manner, since the transmitter voltage, as an individual value, is easier to take into account than the B1 distribution, which is spatially resolved.

The acquisition of the at least one parameter for an object under investigation may also include acquisition of values that are specific to the object under investigation, wherein the values are determined from an electronic patient file and/or a measurement protocol and/or are entered by a user. These values may, for example, describe properties of the object under investigation, such as the age and/or gender and/or weight and/or size of the object under investigation.

In another embodiment, the acquisition of the at least one parameter for the object under investigation includes acquisition of at least one SAR reserve, which is specific to the object under investigation. In this context, the SAR reserve may be acquired with spatial resolution. The at least one SAR reserve is in this case acquired in a preliminary measurement so that limit values for an SAR load on the object under investigation can be maintained for the subsequent acquisition of the magnetic resonance image data. Determination of the SAR reserve may be based on an SAR value that is determined. The SAR reserve may then result from the SAR value. To determine the SAR reserve, magnetic resonance measurement data that were acquired during the preliminary measurement are used to determine absorption of a radio-frequency output in exposed body regions. Here, the mass of the object under investigation, in particular in the exposed body regions, may be taken into account. The at least one SAR reserve then indicates a maximum permitted SAR load that the object under investigation can be subjected to during acquisition of the magnetic resonance image data, for example in the exposed body regions. The at least one SAR reserve may also be indicated specifically for the at least one adiabatic radio-frequency pulse. In that case, the at least one SAR reserve may indicate the maximum SAR load that the at least one adiabatic radio-frequency pulse can supply to the body of the object under investigation, for example an exposed body region. In this way, it is possible to adjust the at least one pulse parameter of the at least one adiabatic radio-frequency pulse in a particularly advantageous manner, taking into account the acquired SAR reserve. For example, in this way the safety of the object under investigation can be increased. As an alternative or in addition, the highest possible image quality of the magnetic resonance image data may be achieved within the boundary conditions predetermined by the SAR reserve, by an advantageous adjustment of the at least one adiabatic radio-frequency pulse.

In another embodiment, the at least one pulse parameter is adjusted by an algorithm that matches the insensitivity range of the at least one adiabatic radio-frequency pulse to the at least one SAR reserve such that a higher SAR reserve brings about an increase in the insensitivity range. This procedure represents a particularly advantageous method of adjusting the at least one pulse parameter. The algorithm may find a compromise between the insensitivity range of the at least one radio-frequency pulse and the SAR load from the at least one adiabatic radio-frequency pulse. This procedure is based on the consideration that increasing the insensitivity range of the at least one adiabatic radio-frequency pulse typically brings about an increase in the amplitude of the at least one radio-frequency pulse and/or a reduction in the duration of a frequency sweep of the at least one radio-frequency pulse and/or an increase in a bandwidth of a frequency sweep of the at least one radio-frequency pulse. However, these measures typically result in an increase in the SAR load from the at least one adiabatic radio-frequency pulse. For example, an increase in the insensitivity range of the at least one adiabatic radio-frequency pulse typically brings about an increase in the SAR load from the at least one adiabatic radio-frequency pulse. If a larger SAR reserve is available for the at least one adiabatic radio-frequency pulse, then the algorithm may adjust the at least one pulse parameter such that the insensitivity range of the at least one adiabatic radio-frequency pulse is increased. In so doing, the insensitivity range of the at least one adiabatic radio-frequency pulse is advantageously increased as much as the SAR reserve permits and/or until the SAR reserve for the at least one adiabatic radio-frequency pulse is exhausted. The at least one adiabatic radio-frequency pulse can thus be made less sensitive to variations in the B0 distribution and/or B1 distribution, and image quality of the magnetic resonance image data can be improved. In the same way, it is also conceivable, if a small variation in the B0 distribution and/or the B1 distribution is detected in the object under investigation, for the algorithm to adjust the at least one pulse parameter of the at least one adiabatic radio-frequency pulse such that an SAR load from the at least one adiabatic radio-frequency pulse is reduced. Thus, patient safety may be enhanced in a particularly advantageous manner. As an alternative or in addition, a higher SAR load may be possible for other elements of the magnetic resonance sequence.

The magnetic resonance apparatus according to the invention includes an image data acquisition scanner and a computer that includes a parameter acquisition processor or module and a parameter adjustment processor or module, with the computer being configured to operate the scanner of the magnetic resonance apparatus so as to perform the method according to the invention.

The magnetic resonance apparatus according to the invention is constructed to perform the method for acquiring magnetic resonance image data of an object under investigation by execution of a magnetic resonance sequence that includes at least one adiabatic radio-frequency pulse. The parameter acquisition processor is designed to acquire at least one parameter for the object under investigation that is specific to the object under investigation. The parameter adjustment processor is designed to adjust at least one pulse parameter of the at least one adiabatic radio-frequency pulse using the at least one parameter for the object under investigation. The image data acquisition scanner is operated to acquire magnetic resonance image data of the object under investigation by execution of the magnetic resonance sequence using the at least one adiabatic radio-frequency pulse with the adjusted at least one pulse parameter.

In an embodiment of the magnetic resonance apparatus, the parameter adjustment processor is configured such that the at least one pulse parameter includes the amplitude of the at least one adiabatic radio-frequency pulse.

In another embodiment of the magnetic resonance apparatus, the parameter adjustment processor is configured to that the at least one pulse parameter includes the duration and/or the bandwidth of a frequency sweep of the at least one adiabatic radio-frequency pulse.

In another embodiment of the magnetic resonance apparatus, the parameter adjustment processor is configured so that the at least one adiabatic radio-frequency pulse includes insensitivity to an insensitivity range of variations of a B0 distribution and/or B1 distribution, with the at least one pulse parameter being adjusted such that the insensitivity range is adapted to the at least one parameter for the object under investigation.

In another embodiment of the magnetic resonance apparatus, the parameter acquisition processor is configured such that acquisition of the at least one parameter for the object under investigation includes acquisition of a B0 distribution and/or B1 distribution of the object under investigation that is specific to that object under investigation.

In a further embodiment of the magnetic resonance apparatus, the parameter acquisition processor is constructed such that acquisition of the at least one parameter for the object under investigation includes acquisition of a value, specific to the object under investigation, of a transmitter voltage that is adjusted during transmitter set-up.

In another embodiment of the magnetic resonance apparatus, the parameter acquisition processor is configured such that acquisition of the at least one parameter for the object under investigation includes acquisition of at least one SAR reserve that is specific to the object under investigation.

In another embodiment of the magnetic resonance apparatus, the parameter adjustment unit is configured such that adjustment of the at least one pulse parameter is performed by means of an algorithm that tunes the insensitivity range of the at least one adiabatic radio-frequency pulse to the at least one SAR reserve such that a higher SAR reserve brings about an increase in the insensitivity range.

A non-transitory, computer-readable data storage medium is loaded directly to a memory of a programmable processor of a magnetic resonance apparatus, and is encoded with programming instructions that cause the processor to operate the apparatus in order to perform the method according to the invention, when the code is executed in the processor. As a result, the method according to the invention may be performed rapidly, robustly and identically reproducibly. The processor unit must meet satisfy preconditions, such as appropriate RAM, appropriate graphics card or appropriate logic unit, to allow the respective method steps to be performed efficiently. The processor can be a local processor that can be connected directly to the magnetic resonance apparatus or configured as part of the magnetic resonance apparatus. Examples of electronically readable data carriers are a DVD, a magnetic tape or a USB stick on which electronically readable control information, in particular software (cf. above), is stored.

The advantages of the magnetic resonance apparatus according to the invention and the storage medium according to the invention correspond substantially to the advantages of the method according to the invention that were described above in detail. Features, advantages or alternative embodiments that are mentioned there are similarly applicable to the other aspects of the invention. The corresponding functional features of the method are formed by corresponding device-related modules, in particular by hardware modules.

BRIEF DESCRIPTION OF THE DRAWINGS

FIG. 1 shows a magnetic resonance apparatus according to the invention in a schematic illustration.

FIG. 2 is a flowchart of a first embodiment of a method according to the invention.

FIG. 3 is a flowchart of a second embodiment of a method according to the invention.

DESCRIPTION OF THE PREFERRED EMBODIMENTS

FIG. 1 schematically shows a magnetic resonance apparatus 11 according to the invention. The magnetic resonance apparatus 11 includes a detector unit that is formed by a scanner 13, having a basic field magnet 17 for the generation of a strong and constant basic magnetic field 18. Moreover, the magnetic resonance scanner 13 has a cylindrical patient-receiving area 14 for receiving an object under investigation 15, in the present case a patient. The patient-receiving area 14 is cylindrically enclosed in a peripheral direction by the scanner 13. The patient 15 can be moved into the patient-receiving area 14 by a patient support 16 of the magnetic resonance apparatus 11. For this purpose, the patient support 16 has a table to lie on, which is arranged movably within the magnetic resonance scanner 13. The scanner 13 is screened to the outside by a housing shell 31.

The scanner 13 further has a gradient coil arrangement 19 for the generation of magnetic field gradients that are used for spatial coding during imaging. The gradient coil arrangement 19 is controlled by a gradient control processor 28. Furthermore, the scanner 13 has a radio-frequency antenna 20, which in the case shown takes the form of a body coil that is integrated in fixed manner in the magnetic resonance scanner 13, and a radio-frequency antenna control processor 29 for the purpose of exciting nuclear spins in the object 15 so as to deviate from the polarization that is established in the basic magnetic field 18 generated by the basic field magnet 17. The radio-frequency antenna unit 20 is controlled by the radio-frequency antenna control processor 29 so as to radiate radio-frequency magnetic resonance sequences into an investigation volume that is formed substantially by the patient-receiving area 14. The radio-frequency antenna unit 20 is furthermore constructed to receive magnetic resonance signals from the patient 15.

For control of the basic field magnet 17, the gradient control processor 28 and the radio-frequency antenna control processor 29, the magnetic resonance apparatus 11 has a control computer 24. The computer 24 exercises central control over the magnetic resonance apparatus 11, for example performing a predetermined imaging gradient echo sequence. Control information, such as imaging parameters, and reconstructed magnetic resonance images can be provided to a user via an interface, in the present case a display monitor 25, of the magnetic resonance apparatus 11. Moreover, the magnetic resonance apparatus 11 has an input interface 26 via which information and/or parameters can be entered by a user during a measuring procedure. The computer 24 may include the gradient control processor 28 and/or radio-frequency antenna control processor 29 and/or the display monitor 25 and/or the input interface 26.

In the case illustrated, the computer 24 includes a parameter acquisition processor 33 and a parameter adjustment processor 34. Furthermore, the magnetic resonance apparatus 11 has an image data acquisition scanner 32. In the present case, the image data acquisition scanner 32 is formed by the scanner 13, together with the radio-frequency antenna control processor 29 and the gradient control processor 28. Thus, the magnetic resonance apparatus 11 is structured, together with the image data acquisition scanner 32 and the computer 24, for performing a method according to the invention.

The magnetic resonance apparatus 11 illustrated may include further components that magnetic resonance apparatuses conventionally have. The general functioning of a magnetic resonance apparatus is known to those skilled in the art, so a detailed description of the further components is not necessary herein.

FIG. 2 is a flowchart of a first embodiment of a method according to the invention for acquiring magnetic resonance image data of an object under investigation 15 by execution of a magnetic resonance sequence that includes at least one adiabatic radio-frequency pulse.

In a method step 40, the parameter acquisition processor 33 of the computer 24 acquires at least one parameter for the object under investigation that is specific to that object under investigation 15.

In a further method step 41, the parameter adjustment processor 34 of the computer 24 adjusts at least one pulse parameter of the at least one adiabatic radio-frequency pulse, using the at least one parameter for the object under investigation.

In a further method step 42, the image data acquisition scanner 32 (scanner 13) of the magnetic resonance apparatus 11 is operated to acquire magnetic resonance image data of the object under investigation 15 by execution of the magnetic resonance sequence, using the at least one adiabatic radio-frequency pulse with the adjusted at least one pulse parameter.

FIG. 3 is a flowchart of a second embodiment of a method according to the invention for acquiring magnetic resonance image data of an object under investigation 15 by means of a magnetic resonance sequence that includes at least one adiabatic radio-frequency pulse.

The description below is substantially limited to the differences from the exemplary embodiment in FIG. 2, wherein the reader is referred to the description of the exemplary embodiment in FIG. 2 for those method steps which remain the same. Method steps which remain substantially the same are always numbered using the same reference numerals.

The embodiment of the method according to the invention that is shown in FIG. 3 substantially includes the method steps 40, 41, 42 of the first embodiment of the method according to the invention according to FIG. 2. In addition, the embodiment of the method according to the invention that is shown in FIG. 3 includes additional method steps and sub-steps. A method sequence that is an alternative to FIG. 3 and which has only some of the method steps and/or sub-steps illustrated in FIG. 2 is also conceivable. An alternative method sequence to FIG. 3 may also have additional method steps and/or sub-steps.

In a further method step 43, the magnetic resonance sequence by which the magnetic resonance image data are to be acquired using the at least one adiabatic radio-frequency pulse may be provided. Provision of the magnetic resonance sequence may include selection and/or preparation of the magnetic resonance sequence. The magnetic resonance sequence may be selected by a user by an input interface 26. It is also possible for the magnetic resonance sequence to be determined by a selected investigation protocol. Provision of the magnetic resonance sequence may also include selection of imaging parameters for the magnetic resonance sequence. The magnetic resonance sequence may in particular provide at least one standard pulse parameter for the at least one adiabatic radio-frequency pulse.

Before the magnetic resonance sequence is applied for the purpose of acquiring the magnetic resonance image data in the further method step 42, the at least one adiabatic radio-frequency pulse may be transferred, with the at least one standard pulse parameter, to the parameter adjustment processor 34. In the further method step 41, the parameter adjustment processor 34 then adapts the at least one standard pulse parameter of the at least one adiabatic radio-frequency pulse, using the at least one parameter for the object under investigation. The at least one adiabatic radio-frequency pulse that has been adjusted in this manner can be transferred to the image data acquisition scanner 32, together with the magnetic resonance sequence, for acquiring the magnetic resonance image data.

Acquisition of the at least one parameter for the object under investigation in the further method step 40 may include, in a first sub-step 40A, acquisition of a B0 distribution and/or B1 distribution of the object under investigation 15 that is specific to that object under investigation. As an alternative or in addition, acquisition of the at least one parameter for the object under investigation in the further method step 40 may include, in a second sub-step 40B, acquisition of a value, specific to the object under investigation, of a transmitter voltage that is adjusted during transmitter set-up. As an alternative or in addition, acquisition of the at least one parameter for the object under investigation in the further method step 40 may include, in a third sub-step 40C, acquisition of at least one SAR reserve that is specific to the object under investigation. The three sub-steps 40A, 40B, 40C may in this case be used separately from one another or in combination. It is conceivable for only some of the three sub-steps 40A, 40B, 40C to be used, with the result for example that only a B1 distribution and an SAR reserve are acquired in the further method step 40. Any desired combinations of the three sub-steps 40A, 40B, 40C are conceivable in this context for acquiring the parameter for the object under investigation. Further or other parameters for the object under investigation may be acquired in the further method step 40 than those illustrated in FIG. 3.

In the further method step 41, adjustment of the at least one pulse parameter includes, by way of example in a first sub-step 41A, adjustment of an amplitude of the at least one adiabatic radio-frequency pulse. As an alternative or in addition, in a second sub-step 41B adjustment of the at least one pulse parameter may include adjustment of a duration and/or a bandwidth of a frequency sweep of the at least one adiabatic radio-frequency pulse. Adjustment of the at least one pulse parameter in the further method step 41 may include adjustment of further or alternative pulse parameters that are not illustrated in FIG. 3.

The at least one adiabatic radio-frequency pulse includes in particular insensitivity to an insensitivity range of variations of a B0 distribution and/or B1 distribution. In a third sub-step 41C of the further method step 41, the insensitivity range is adapted to the at least one parameter for the object under investigation. In this case, an algorithm adjusts the at least one pulse parameter such that the insensitivity range of the at least one adiabatic radio-frequency pulse is adapted to the at least one parameter for the object under investigation. Here, the amplitude of the at least one adiabatic radio-frequency pulse and/or the duration and/or bandwidth of the frequency sweep of the at least one adiabatic radio-frequency pulse may be selected suitably for the insensitivity range of the at least one adiabatic radio-frequency pulse to be adapted.

In the third sub-step 41C the insensitivity range of the at least one adiabatic radio-frequency pulse is adapted to the at least one SAR reserve such that a higher SAR reserve brings about an increase in the insensitivity range. In the same way, a smaller determined B0 variation and/or B1 variation can result in a reduction in an SAR load from the at least one adiabatic radio-frequency pulse.

The method steps of the method according to the invention that are illustrated in FIG. 2-3 are performed by the computer. For this purpose, the computer includes necessary software and/or computer programs that are stored in a memory unit of the computer. The software and/or computer programs include programming means that are set up to perform the method according to the invention when the computer program and/or the software in the computer are performed by means of a processor module of the computer.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquiring magnetic resonance data from an object, comprising:
   providing a computer with an electronic designation of at least one parameter of an object that is specific to the object;
   in said computer, using said at least one parameter that is specific to the object to adjust at least one pulse parameter of an adiabatic radio-frequency pulse in a magnetic resonance data acquisition sequence that will be executed by a magnetic resonance scanner in order to acquire magnetic resonance data from the object; and
   from said computer, operating said magnetic resonance scanner to acquire said magnetic resonance data from the object using the adiabatic radio-frequency pulse with the adjusted at least one pulse parameter, and making the acquired image data available from the computer in electronic form as a data file.

2. A method as claimed in claim 1 comprising providing said data file to a reconstruction processor and, in said reconstruction processor, applying an image reconstruction algorithm to said magnetic resonance data in said data file to reconstruct an image of the object.

3. A method as claimed in claim 1 comprising adjusting an amplitude of said adiabatic radio-frequency pulse, as said at least one pulse parameter.

4. A method as claimed in claim 1 wherein said adiabatic radio-frequency pulse has a frequency sweep associated therewith, and adjusting at least one of a duration of said frequency sweep and a bandwidth of said frequency sweep, as said at least one pulse parameter.

5. A method as claimed in claim 1 wherein said magnetic resonance scanner comprises a basic field magnet that generates a basic magnetic field during acquisition of said magnetic resonance data, and wherein said adiabatic radio-frequency pulse contributes to generation of a radio-frequency field during acquisition of said magnetic resonance data, and wherein said basic magnetic field has a basic magnetic field distribution and said radio-frequency field has a radio-frequency field distribution, and wherein said adiabatic radio-frequency pulse has an insensitivity to an insensitivity range of variations in at least one of said basic magnetic field distribution and said radio-frequency field distribution, and comprising adjusting said insensitivity range, as said at least one pulse parameter, dependent on said at least one parameter of said object.

6. A method as claimed in claim 5 comprising providing said computer with an electronic designation of said basic magnetic field distribution that is specific to the object, as said at least one parameter of the object.

7. A method as claimed in claim 5 comprising providing said computer with an electronic designation of said radio-frequency field distribution that is specific to the object, as said at least one parameter of the object.

8. A method as claimed in claim 1 wherein said magnetic resonance scanner comprises a radio-frequency transmitter via which said adiabatic radio-frequency pulse is emitted during the acquisition of said magnetic resonance data, and comprising providing said computer with an electronic designation of a transmitter voltage of said transmitter that is specific to the object, as said parameter of the object.

9. A method as claimed in claim 1 comprising providing said computer with an electronic designation of a specific absorption rate reserve that is specific to the object, as said at least one parameter of the object.

10. A method as claimed in claim 9 wherein said magnetic resonance scanner comprises a basic field magnet that generates a basic magnetic field during acquisition of said magnetic resonance data, and wherein said adiabatic radio-frequency pulse contributes to generation of a radio-frequency field during acquisition of said magnetic resonance data, and wherein said basic magnetic field has a basic magnetic field distribution and said radio-frequency field has a radio-frequency field distribution, and wherein said adiabatic radio-frequency pulse has an insensitivity to an insensitivity range of variations in at least one of said basic magnetic field distribution and said radio-frequency field distribution, and comprising adjusting said insensitivity range, as said at least one pulse parameter, dependent on said at least one parameter of said object, and comprising adjusting said at least one pulse parameter by executing an algorithm in said computer that adjusts said insensitivity range to said SAR reserve wherein, in said algorithm, a higher specific absorption rate reserve causes an increase in said insensitivity range.

11. A magnetic resonance apparatus comprising:
   a magnetic resonance scanner;
   a computer provided with an electronic designation of at least one parameter of an object that is specific to an object from which magnetic resonance data are to be acquired;
   said computer being configured to use said at least one parameter that is specific to the object to adjust at least one pulse parameter of an adiabatic radio-frequency pulse in a magnetic resonance data acquisition sequence that will be executed by the magnetic resonance scanner in order to acquire magnetic resonance data from the object; and
   said computer being configured to operate said magnetic resonance scanner to acquire said magnetic resonance data from the object using the adiabatic radio-frequency pulse with the adjusted at least one pulse parameter, and to make the acquired image data available from the computer in electronic form as a data file.

12. A non-transitory, computer-readable data storage medium encoded with programming instructions, said storage medium being loaded into a computer of a magnetic resonance apparatus that comprises a magnetic resonance scanner, and said programming instructions causing said computer to:
   receive an electronic designation of at least one parameter of an object that is specific to the object from which magnetic resonance data are to be acquired;

use said at least one parameter that is specific to the object to adjust at least one pulse parameter of an adiabatic radio-frequency pulse in a magnetic resonance data acquisition sequence that will be executed by the magnetic resonance scanner in order to acquire said magnetic resonance data from the object; and operate said magnetic resonance scanner to acquire said magnetic resonance data from the object using the adiabatic radio-frequency pulse with the adjusted at least one pulse parameter, and make the acquired image data available from the computer in electronic form as a data file.

* * * * *